United States Patent
Barnett

(10) Patent No.: US 7,259,624 B2
(45) Date of Patent: Aug. 21, 2007

(54) LOW NOISE AC COUPLED AMPLIFIER WITH LOW BAND-PASS CORNER AND LOW POWER

(75) Inventor: Raymond Elijah Barnett, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/069,030

(22) Filed: Feb. 28, 2005

(65) Prior Publication Data

US 2006/0192617 A1    Aug. 31, 2006

(51) Int. Cl.
*H03F 3/45*    (2006.01)

(52) U.S. Cl. .................. 330/252; 330/300; 330/261

(58) Field of Classification Search ............. 330/252, 330/253, 300, 261
See application file for complete search history.

(56) References Cited

U.S. PATENT DOCUMENTS

| | | | | |
|---|---|---|---|---|
| 5,382,916 A * | 1/1995 | King et al. | .................. | 330/253 |
| 6,057,972 A * | 5/2000 | Castellucci | .................. | 360/66 |
| 6,150,876 A * | 11/2000 | Ngo | .................. | 327/563 |
| 6,831,799 B2 * | 12/2004 | Pakriswamy et al. | .......... | 360/67 |
| 6,967,525 B2 * | 11/2005 | Price, Jr. | ..................... | 327/542 |
| 7,082,004 B2 * | 7/2006 | Kajiyama et al. | ............. | 360/46 |

* cited by examiner

*Primary Examiner*—Patricia Nguyen
(74) *Attorney, Agent, or Firm*—Wade J. Brady, III; Frederick J. Telecky, Jr.

(57) ABSTRACT

A low noise AC coupled amplifier having transistors sharing bias currents, and having a low band-pass corner frequency and consuming low power. The amplifier may be used in a magneto-resistive (MR) preamplifier to amplify a response from a MR sensor. Bipolar and MOS transistors are used in the front end, utilizing the advantages of each transistor type to achieve low noise as well as low band-pass corner. The amplifier has a modified structure achieving lower power by using a PNP transistor instead of an NPN transistor.

4 Claims, 2 Drawing Sheets

LOW NOISE AC COUPLED AMPLIFIER WITH LOW BAND-PASS CORNER AND LOW POWER

FIELD OF THE INVENTION

The present invention is generally related to amplifiers, and more particularly to low noise AC coupled amplifiers suitable for use with magneto-resistive (MR) sensors.

BACKGROUND OF THE INVENTION

Front end amplifiers are conventionally used to amplify low voltage signals provided by a magneto-resistive (MR) sensor adapted to read a hard disk drive (HDD). These amplifiers are designed to produce low noise, and produce a low corner frequency. There is a trade-off between low noise and a low corner frequency, depending on the transistor design utilized in the amplifier. There is a need for an improved lower power amplifier suitable amplifying MR sensor signals.

SUMMARY OF THE INVENTION

The present invention achieves technical advantages as a low noise AC coupled amplifier configured to share bias currents providing both a low band-pass corner and low noise. In one embodiment of the invention, PNP transistors are optimally placed for low noise and NMOS transistors are optimally placed for achieving a low band-pass corner frequency. By sharing the bias currents, power can be reduced ⅓ over conventional designs. Moreover, a reference voltage can be 0 rather than $V_{EE}$ to provide an additional 50% power savings over previous designs.

DETAILED DESCRIPTION OF THE PREFERRED EMBODIMENT

Figure 1:
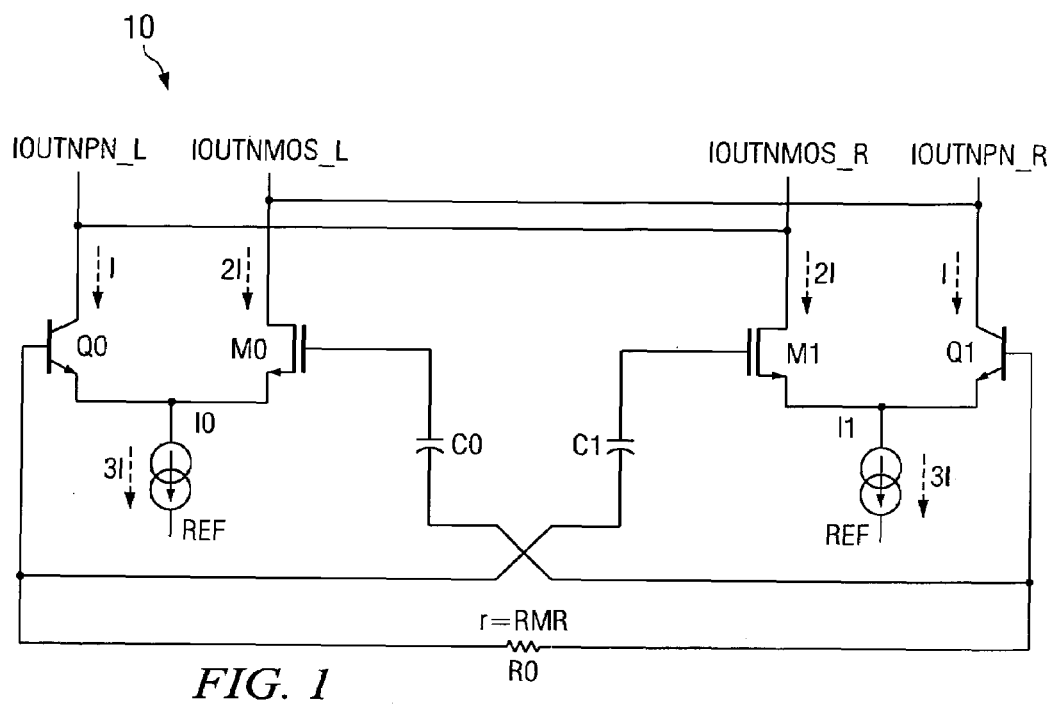
FIG. 1 is an electrical schematic of a prior art front end amplifier suitable for use with a MR sensor.

A conventional MR amplifier is shown at 10 in FIG. 1, seen to include a MR sensor depicted as resistor R0 which serves as the magnetic sensor in the HDD system. This resistor R0 can be represented as the signal in series with the resistance value of the sensor. For non-magnetic applications, any sensor can be inserted here. Conventionally, the MR sensor requires a bias of several hundred millivolts to be applied to it. The signal output is on the order of 1 mV, and the gain required to amplify the signal is on the order of 100V/V. Thus, an AC coupled amplifier is required to remove the large DC offset and only amplify the small signal to be processed by subsequent stages. This may be accomplished through the use of AC coupling capacitors C0 and C1. Other ways to provide a band-pass transfer function can be used also.

An additional circuit is required to drive the gates of NMOS transistors M0 and M1 to the proper operating point such that transistors Q0 and M0 are operating in the active and saturation regions, respectively. Likewise, transistors Q1 and M1 are biased in the same manner. When this is done the difference in voltage between the gates of NMOS transistors M0 and M1 is equal to the difference in voltage between the bases of bipolar transistors Q0 and Q1. This voltage difference is equal to the MR bias voltage applied across the MR sensor, resistor R0.

Low noise is achieved by using bipolar transistors Q0 and Q1, and the low corner frequency is achieved by using NMOS transistors M0 and M1. The same structure can be used with all NPN transistors, or all NMOS transistors, but the results would be low noise-higher corner for the all NPN version, and higher noise-low corner for the NMOS version.

According to the present invention, by combining the best of both worlds, a compromise on both noise and low corner is achieved and results in a better overall amplifier when used in a system that needs both low noise and a low corner frequency, such as the MR preamplifier application.

Figure 2:
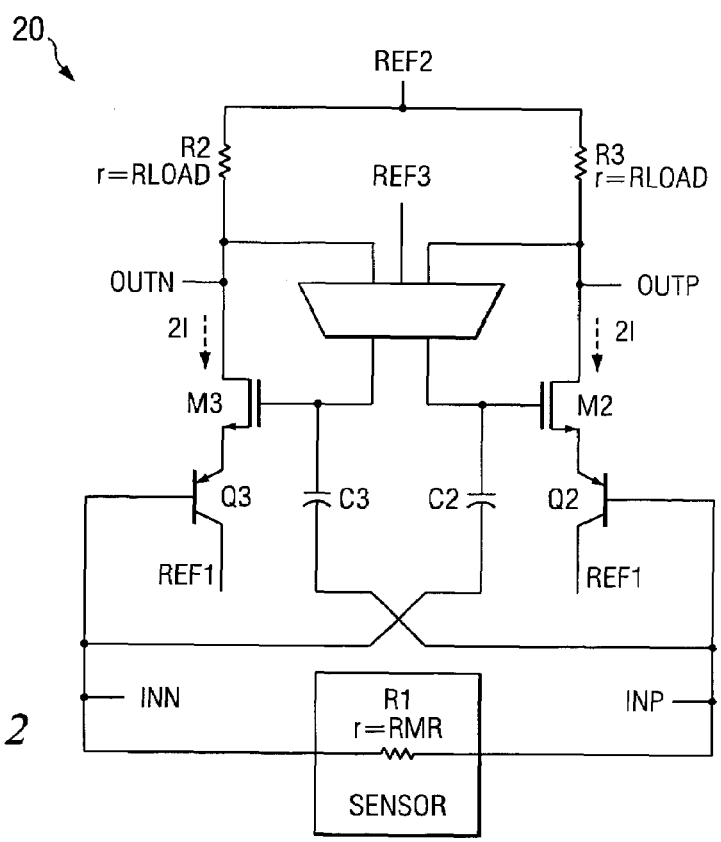
FIG. 2 is an electrical schematic of one embodiment of the present invention.
Figure 3:
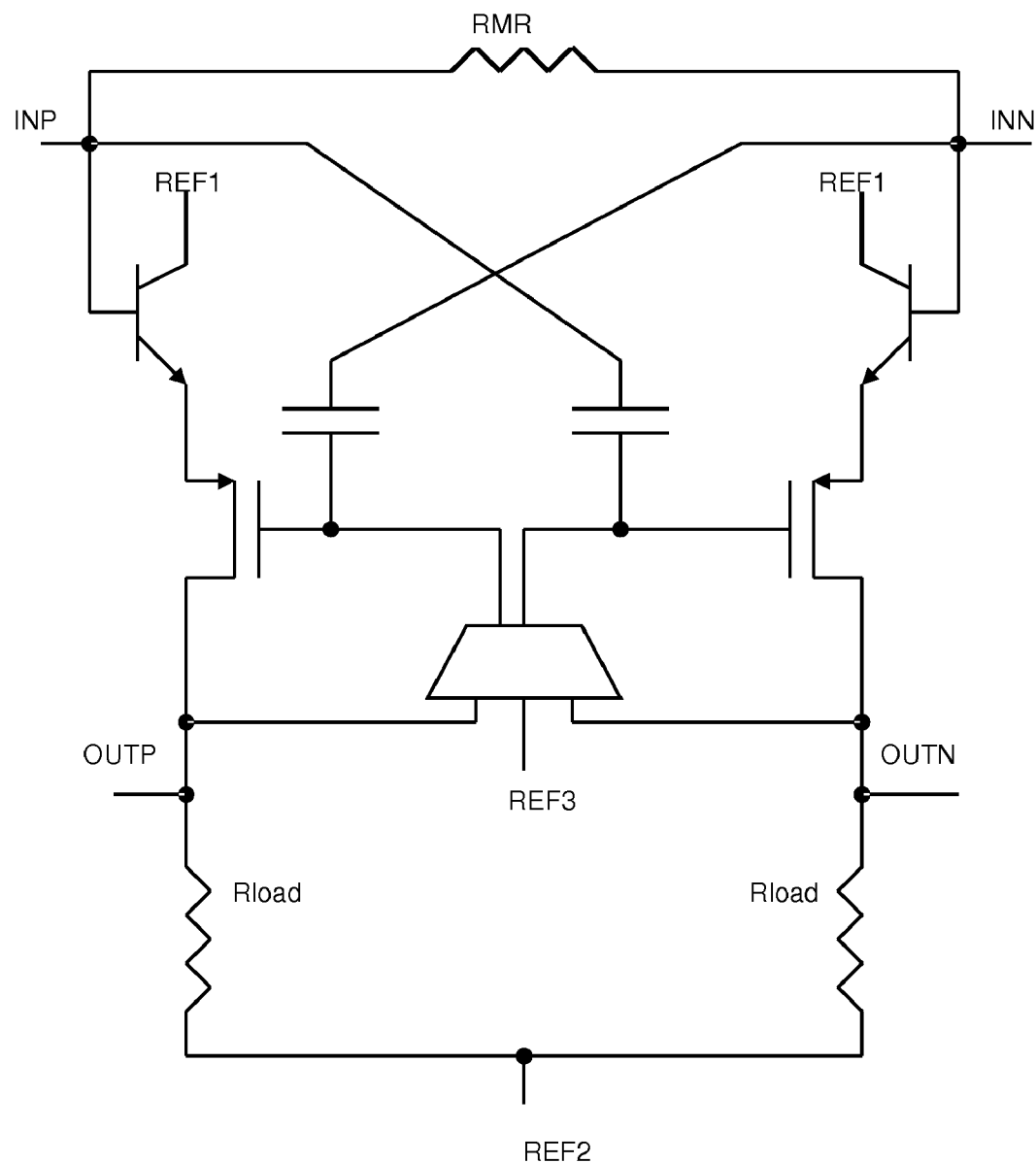
FIG. 3 is an electrical schematic of another embodiment of the present invention.

One embodiment of an amplifier according to the present invention is shown at 20 in FIG. 2. The front end amplifier 20 advantageously utilizes a pair of low noise vertical bipolar PNP transistors arranged to provide low power. Low power is achieved by using the bias current of the low noise PNP transistors Q2 and Q3 to also bias the respective NMOS transistors M2 and M3. Alternatively, this shared bias current arrangement can also be achieved with an NPN/PMOS input stage, as shown in FIG. 3.

This sharing architecture saves approximately ⅓ power over current designs. Additionally, reference REF1 can be connected to GROUND (0V) instead of VEE (−5V). This optional design can save an additional 50% of power.

Referring to FIGS. 1 and 2, this power savings can be appreciated, whereby conducted current is shown. Referring to FIG. 1, current I flowing through the NPN transistors, and current 2I flowing through the NMOS transistors, realizes a total current of 6I. In contrast, according to the embodiment of the present invention shown in FIG. 2, current 2I flows through each of the NMOS transistors. The bias current for all 4 transistors is shared, and a total current of 4I is conducted. This realizes a current savings of 2I, translating to a ⅓ power savings, depending on how the bins current to the NPN and NMOS transistors are distributed.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. An amplifier for a magneto-resistive sensor, comprising:

(a) first and second inputs for coupling to a magneto-resistive sensor;

(b) first and second outputs;

(c) a first MOS transistor and a first bipolar transistor in series with the source of said first MOS transistor connected to the emitter of said first bipolar transistor, the base of said first bipolar transistor connected to said first input and the gate of said first MOS transistor coupled to said second input, the collector of said first bipolar transistor connected to a first reference, and the drain of said first MOS connected to a first load resistor; and (d) a second MOS transistor and a second bipolar transistor in series with the source of said second MOS transistor connected to the emitter of said second bipolar transistor, the base of said second bipolar transistor connected to said second input and the gate of said second MOS transistor coupled to said first input, the collector of said second bipolar transistor connected to said first reference, and the drain of said second MOS connected to a second load resistor.

2. The amplifier of claim 1, wherein said first and second MOS transistors are NMOS and said first and second bipolar transistors are PNP.

3. The amplifier of claim 1, wherein said first and second MOS transistors are PMOS and said first and second bipolar transistors are NPN.

4. The amplifier of claim 1, further comprising a bias circuit with inputs connected to said drains of said first MOS transistor and said second MOS transistor and with outputs connected to said gates of said first MOS transistor and said second MOS transistor.

* * * * *